United States Patent
Lee et al.

(10) Patent No.: US 11,114,173 B2
(45) Date of Patent: *Sep. 7, 2021

(54) SEMICONDUCTOR MEMORY DEVICE AND METHOD OF OPERATING THE SAME

(71) Applicant: SK hynix Inc., Incheon-si (KR)

(72) Inventors: Hye Lyoung Lee, Suwon-si Gyeonggi-do (KR); Bong Hoon Lee, Seoul (KR); Chan Lim, Seongnam-si Gyeonggi-do (KR)

(73) Assignee: SK hynix inc., Icheon-si (KR)

( * ) Notice: Subject to any disclaimer, the term of this patent is extended or adjusted under 35 U.S.C. 154(b) by 158 days.

This patent is subject to a terminal disclaimer.

(21) Appl. No.: 16/510,508

(22) Filed: Jul. 12, 2019

(65) Prior Publication Data

US 2019/0333593 A1    Oct. 31, 2019

Related U.S. Application Data

(63) Continuation-in-part of application No. 15/651,477, filed on Jul. 17, 2017, now Pat. No. 10,403,367.

(30) Foreign Application Priority Data

Dec. 29, 2016    (KR) .................. 10-2016-0182696

(51) Int. Cl.
*G11C 16/34*    (2006.01)
*G11C 16/04*    (2006.01)
(Continued)

(52) U.S. Cl.
CPC ...... *G11C 16/3459* (2013.01); *G11C 11/5628* (2013.01); *G11C 11/5671* (2013.01);
(Continued)

(58) Field of Classification Search
CPC ... G11C 16/102; G11C 16/3459; G11C 16/26; G11C 16/16; G11C 16/30; G11C 16/08
See application file for complete search history.

(56) References Cited

U.S. PATENT DOCUMENTS

| 7,443,726 B2 | 10/2008 | Guterman |
| 8,369,157 B2 | 2/2013 | Moschiano et al. |

(Continued)

FOREIGN PATENT DOCUMENTS

| CN | 1619704 A | 5/2005 |
| CN | 101206923 A | 6/2008 |

(Continued)

*Primary Examiner* — Mohammed A Bashar
(74) *Attorney, Agent, or Firm* — William Park & Associates Ltd.

(57) ABSTRACT

Provided herein may be a semiconductor memory device and a method of operating the same. The semiconductor memory device may include peripheral circuits configured to perform a verify operation on selected memory cells by applying a verify voltage to a word line, and perform a compensation program operation on the selected memory cells by applying a compensation program voltage to the word line; and a control logic configured to control the peripheral circuits such that the compensation program operation is performed by applying the compensation program voltage to the selected memory cells to be programmed to a selected threshold voltage distribution among the threshold voltage distributions other than a highest threshold voltage distribution, wherein the compensation program voltage has a positive voltage lower than the main program voltage most recently applied to the word line.

10 Claims, 13 Drawing Sheets

(51) Int. Cl.
  *G11C 16/10* (2006.01)
  *G11C 16/30* (2006.01)
  *G11C 11/56* (2006.01)
  *G11C 16/26* (2006.01)

(52) U.S. Cl.
  CPC .......... *G11C 16/0483* (2013.01); *G11C 16/10* (2013.01); *G11C 16/26* (2013.01); *G11C 16/30* (2013.01); *G11C 2211/5621* (2013.01); *G11C 2211/5642* (2013.01)

(56) References Cited

U.S. PATENT DOCUMENTS

| | | | |
|---|---|---|---|
| 2008/0055979 A1* | 3/2008 | Shim | G11C 16/3422 |
| | | | 365/185.02 |
| 2009/0052269 A1 | 2/2009 | Moschiano et al. | |
| 2009/0161443 A1* | 6/2009 | Yang | G11C 16/10 |
| | | | 365/189.05 |
| 2012/0224429 A1 | 9/2012 | Moschiano et al. | |
| 2015/0348633 A1 | 12/2015 | Song et al. | |

FOREIGN PATENT DOCUMENTS

| | | |
|---|---|---|
| KR | 100335769 B1 | 5/2002 |
| KR | 100719697 B1 | 5/2007 |
| KR | 1020160000034 | 1/2016 |

* cited by examiner

SEMICONDUCTOR MEMORY DEVICE AND METHOD OF OPERATING THE SAME

CROSS-REFERENCE TO RELATED APPLICATION

The present application is a continuation-in-part application of U.S. patent application Ser. No. 15/651,477, filed on Jul. 17, 2017, and claims priority under 35 U.S.C. § 119(a) to Korean patent application number 10-2016-0182696 filed on Dec. 29, 2016 in the Korean Intellectual Property Office, the entire disclosure of which is incorporated herein by reference.

BACKGROUND

1. Technical Field

Various embodiments of the present disclosure generally relate to a semiconductor memory device and a method of operating the same, and more particularly, to a program operation of the semiconductor memory device.

2. Related Art

Memory devices are classified into a volatile memory device and a nonvolatile memory device.

The nonvolatile memory device may maintain data stored therein even when supply of power is interrupted, although the read and write speeds of the nonvolatile memory device are relatively low compared to those of the volatile memory device. Therefore, the nonvolatile memory device is widely used for portable electronic devices so as to store data that must be maintained regardless of supply of power.

According to a method of storing data, nonvolatile memory devices may be classified into a read-only memory (ROM), a mask ROM (MROM), a programmable ROM (PROM), an erasable programmable ROM (EPROM), an electrically erasable programmable ROM (EEPROM), a flash memory, a phase-change random access memory (PRAM), a magnetic RAM (MRAM), a resistive RAM (RRAM), a ferroelectric RAM (FRAM), etc.

Among the nonvolatile memory devices, the flash memory device may have a two-dimensional structure in which cell strings are horizontally arranged on a semiconductor substrate, or a three-dimensional structure in which cell strings are vertically arranged on a semiconductor substrate. The three-dimensional memory device is a device which is devised to overcome a limitation in the degree of integration of the two-dimensional memory device and may include a plurality of memory cells which are vertically stacked on a semiconductor substrate.

SUMMARY

Various embodiments of the present disclosure are directed to a semiconductor memory device which has improved reliability in a program operation and a method of operating the same.

An embodiment of the present disclosure may provide for a semiconductor memory device including: a plurality of memory cells configured to be programmed to have different threshold voltage distributions; peripheral circuits configured to perform a program operation on selected memory cells among the plurality of memory cells by applying a main program voltage to a word line coupled to the plurality of memory cells, perform a verify operation on the selected memory cells by applying a verify voltage to the word line, and perform a compensation program operation on the selected memory cells by applying a compensation program voltage to the word line; and a control logic configured to control the peripheral circuits such that the compensation program operation is performed by applying the compensation program voltage to the selected memory cells to be programmed to a selected threshold voltage distribution among the threshold voltage distributions other than a highest threshold voltage distribution, wherein the compensation program voltage has a positive voltage lower than the main program voltage most recently applied to the word line.

DETAILED DESCRIPTION

Figure 1:
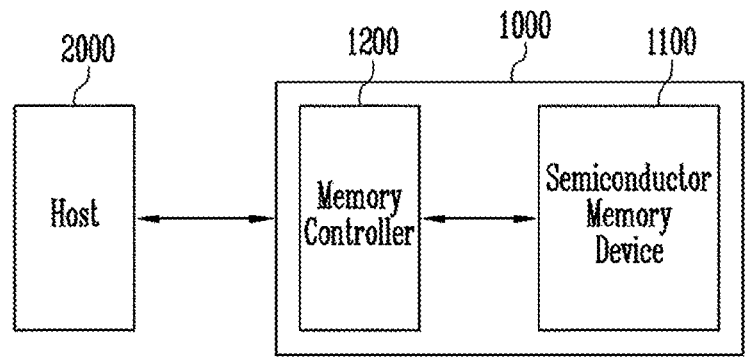
FIG. 1 is a block diagram illustrating a memory system in accordance with an embodiment of the present disclosure.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey a scope of example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present.

Hereinafter, embodiments will be described with reference to the accompanying drawings. Embodiments are described herein with reference to cross-sectional illustrations that are schematic illustrations of embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements.

Terms such as 'first' and 'second' may be used to describe various components, but the terms should not limit the various components. Those terms are only used for the purpose of differentiating a component from other components. For example, a first component may be referred to as a second component, and a second component may be referred to as a first component and so forth without departing from the spirit and scope of the present disclosure. Furthermore, 'and/or' may include any one of or a combination of the components mentioned.

Furthermore, a singular form may include a plural from as long as it is not specifically mentioned in a sentence. Furthermore, "include/comprise" or "including/comprising" used in the specification represents that one or more components, steps, operations, and elements exist or are added.

Furthermore, unless defined otherwise, all the terms used in this specification including technical and scientific terms have the same meanings as would be generally understood by those skilled in the related art. The terms defined in generally used dictionaries should be construed as having the same meanings as would be construed in the context of the related art, and unless clearly defined otherwise in this specification, should not be construed as having idealistic or overly formal meanings.

It is also noted that in this specification, "connected/coupled" refers to one component not only directly coupling another component but also indirectly coupling another component through an intermediate component. On the other hand, "directly connected/directly coupled" refers to one component directly coupling another component without an intermediate component.

FIG. 1 is a diagram illustrating a memory system in accordance with an embodiment of the present disclosure.

Referring to FIG. 1, a memory system 1000 may include a semiconductor memory device 1100 which stores data, and a memory controller 1200 which controls the semiconductor memory device 1100 under control of a host 2000.

The host 2000 may communicate with the memory system 1100 using an interface protocol such as a peripheral component interconnect-express (PCI-E), an advanced technology attachment (ATA), a serial ATA (SATA), a parallel ATA (PATA), or a serial attached SCSI (SAS). In addition, the interface protocol provided for the purpose of data communication between the host 2000 and the memory system 1000 may be an interface protocol such as a Universal Serial Bus (USB), a Multi-Media Card (MMC), an Enhanced Small Disk Interface (ESDI), or Integrated Drive Electronics (IDE).

The memory controller 1200 may control overall operation of the memory system 1000 and data exchange between the host 2000 and the semiconductor memory device 1100. For example, the memory controller 1200 may control the semiconductor memory device 1100 to program or read data in response to a request from the host 2000. In addition, the memory controller 1200 may store information of main memory blocks and sub-memory blocks that are included in the semiconductor memory device 1100, and select the semiconductor memory device 1100 such that a program operation is performed on the main memory block or the sub-memory block according to the amount of data loaded for the program operation. According to an embodiment, the semiconductor memory device 1100 may include a double data rate synchronous dynamic random access memory (DDR SDRAM), a low power DDR SDRAM fourth generation (LPDDR4 SDRAM), a graphics double data rate SDRAM (GDDR SDRAM), a low power DDR (LPDDR), a Rambus dynamic random access memory (RDRAM), or a flash memory.

The semiconductor memory device 1100 may perform a program, read, or erase operation under control of the memory controller 1200. For example, the semiconductor memory device 1100 may program memory cells included in a selected page. For example, if a program verify operation of a selected page has passed, the semiconductor memory device 1100 may further perform a compensation program operation for improving retention characteristics of memory cells programmed to have the highest threshold voltage. Here, the retention characteristics refer to characteristics in which threshold voltages of the memory cells may be retained.

Figure 2:
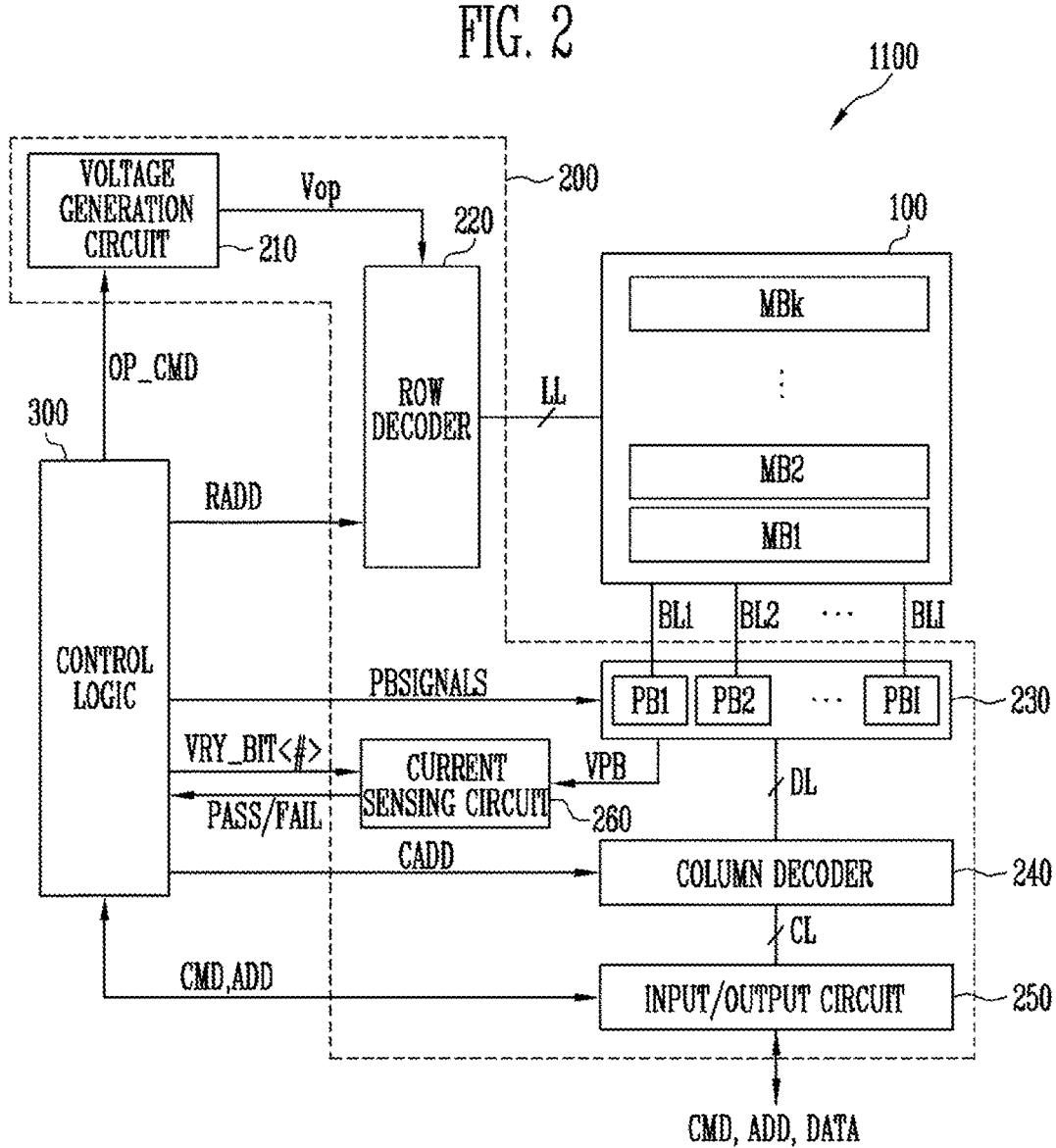
FIG. 2 is a block diagram illustrating a memory device of FIG. 1.

FIG. 2 is a diagram illustrating the memory device of FIG. 1.

Referring to FIG. 2, the memory device 1110 may include a memory cell array 100 configured to store data. The memory device 1110 may include peripheral circuits 200 configured to perform a program operation for storing data in the memory cell array 100, a read operation for outputting the stored data, and an erase operation for erasing the stored data. The memory device 1110 may include a control logic 300 configured to control the peripheral circuits 200 under control of the memory controller (1200 of FIG. 1).

The memory cell array 100 may include a plurality of memory blocks MB1 to MBk (k is a positive integer). Local lines LL and bit lines BL1 to BLl (l is a positive integer) may be coupled to each of the memory blocks MB1 to MBk. For example, the local lines LL may include word lines, drain and source select lines. For example, the local lines LL may include the word lines, the drain and source select lines, and source lines. For example, the local lines LL may further include dummy lines. For example, the local lines LL may further include pipe lines.

The local lines LL may be respectively coupled to the memory blocks MB1 to MBk, and the bit lines BL1 to BLl may be coupled in common to the memory blocks MB1 to MBk. The memory blocks MB1 to MBk may be embodied in a two-dimensional or three-dimensional structure.

The peripheral circuits 200 may be configured to perform program, read, and erase operations on a selected memory block under control of the control logic 300. For example, the peripheral circuits 200 may include a voltage generation circuit 210, a row decoder 220, a page buffer group 230, a column decoder 240, an input/output circuit 250, and a current sensing circuit 260. The peripheral circuits 200 may be disposed parallel to the memory cell array 100 on the substrate, or may be disposed between the substrate and the memory cell array 100. For example, the peripheral circuits 200 are formed on the substrate, and the memory cell array 100 may be stacked on the peripheral circuits 200.

The voltage generation circuit 210 may generate various operating voltages Vop to be used for program, read, and erase operations in response to an operating signal OP_CMD. For example, the voltage generation circuit 210 may generate a program voltage, a verify voltage, a pass voltage, a compensation program voltage, a read voltage, an erase voltage, a turn-on voltage, and so forth, under control of the control logic 300. In one example, under control of the control logic 300, the voltage generation circuit 210 may generate program voltages increasing in steps during a main program operation and a compensation program voltage during a compensation program operation.

The row decoder 220 may deliver operating voltages Vop to the local lines LL coupled to a selected memory block in response to a row address RADD.

The page buffer group 230 may include a plurality of page buffers PB1 to PBl coupled to the bit lines BL1 to BLl. The page buffers PB1 to PBl may operate in response to page buffer control signals PBSIGNALS. For example, the page buffers PB1 to PBl may temporarily store data received through the bit lines BL1 to BLl, or sense voltages or currents of the bit lines BL1 to BLl during a read or verify operation.

The column decoder 240 may transmit data between the input/output circuit 250 and the page buffer group 230 in response to a column address CADD. For example, the column decoder 240 may exchange data with the page buffers PB through data lines DL or exchange data with the input/output circuit 250 through column lines CL.

The input/output circuit 250 may transmit a command CMD or an address ADD received from the memory controller (1200 of FIG. 1) to the control logic 300, or exchange data DATA with the column decoder 240.

During the read or verify operation, the current sensing circuit 260 may generate a reference current in response to an enable bit VRY_BIT<#>, and may compare a sensing voltage VPB received from the page buffer group 230 with a reference voltage generated by the reference current, and output a pass signal PASS or a fail signal FAIL.

The control logic 300 may output an operating signal OP_CMD, a row address RADD, page buffer control signals PBSIGNALS, and an enable bit VRY_BIT<#> in response to a command CMD and an address ADD and thus control the peripheral circuits 200. In addition, the control logic 300 may determine whether a verify operation has passed or failed in response to a pass or fail signal PASS or FAIL. In particular, during a program operation, after a main program operation of a selected page has completed, the control logic 300 may control the peripheral circuits 200 so that a compensation program operation of the selected page is performed on memory cells having lower threshold voltage retention characteristics than remaining memory cells. In one example, when the main program operation of the selected page has completed, the control logic 200 reloads data DATA that was used during the main program operation.

Figure 3:
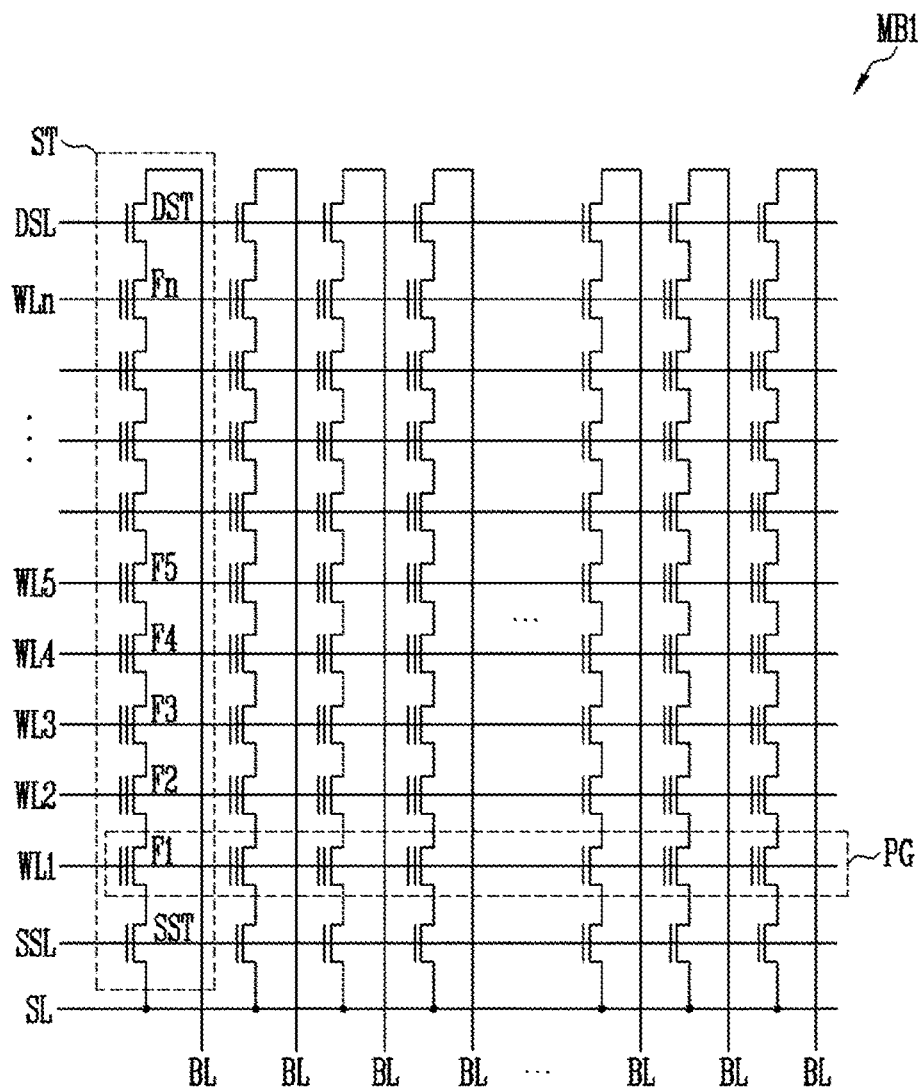
FIG. 3 is a diagram illustrating a memory block of FIG. 2.

FIG. 3 is a diagram illustrating a memory block of FIG. 2.

Referring to FIG. 3, since the memory blocks MB1 to MBk have the same or similar configuration, a first memory block MB1 among the memory blocks MB1 to MBk will be described as an example.

The first memory block MB1 may include a plurality of cell strings ST coupled between the bit lines BL and a source line SL. For example, the cell strings ST may be respectively coupled to the bit lines BL, and be coupled in common to the source line SL. Since the cell strings ST have the same or similar configuration, one cell string ST among them will be described as an example.

The cell string ST may include a source select transistor SST, first to n-th memory cells F1 to Fn (n is a positive integer), and a drain select transistor DST which are coupled in series to each other between the source line SL and a corresponding bit line BL. Because FIG. 3 shows only one embodiment provided for the sake of understanding the configuration of the first memory block MB1, the number of source and drain select transistors SST and DST and the number of first to n-th memory cells F1 to Fn are not limited to those shown in FIG. 3. The source select transistor SST may be coupled between the source line SL and the first memory cell F1. The first to n-th memory cells F1 to Fn may be coupled in series between the source select transistor SST and the drain select transistor DST. The drain select transistor DST may be coupled between the n-th memory cell Fn and the bit line BL. Although not shown, dummy cells may be further coupled between the memory cells F1 to Fn, or between the source select transistor SST and the drain select transistor DST.

Gates of the source select transistors SST included in different cell strings ST may be coupled to the source select line SSL. Gates of the first to n-th memory cells F1 to Fn may be respectively coupled to first to n-th word lines WL1 to WLn. Gates of the drain select transistors DST may be coupled to a drain select line DSL.

A group of memory cells coupled to the same word line refers to a page PG. Each of program and read operations may be performed on a page basis in a selected memory block.

Figure 4:
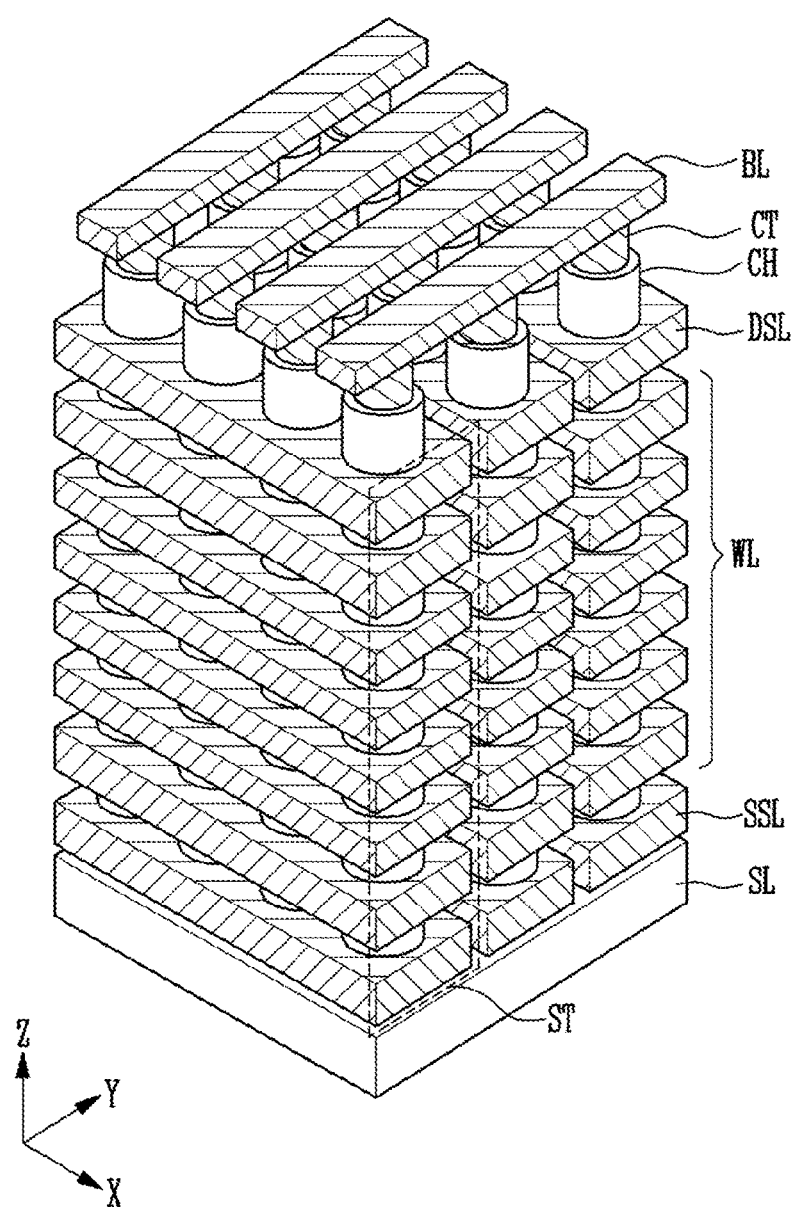
FIG. 4 is a perspective diagram illustrating an embodiment of a memory block having a three-dimensional structure.

FIG. 4 is a perspective diagram illustrating an embodiment of a memory block having a three-dimensional structure.

Referring to FIG. 4, the memory block having a three-dimensional structure may include a plurality of cell strings ST formed in a vertical direction (e.g., Z-direction) on a substrate and arranged between the bit lines BL and the source lines SL. For example, the cell strings ST may be formed in an I-shape. This structure may be called "Bit Cost Scalable" (BiCS). For example, in the case where the source line SL is horizontally formed on the substrate, the cell strings ST having a BiCS structure may be formed vertically (e.g., in the Z-direction) on the source line SL.

In more detail, each of the cell strings ST may be arranged in a first direction (e.g., X-direction) and a second direction (e.g., Y-direction). The cell strings ST may include may include source select lines SSL, word lines WL, and drain select lines DSL, which are stacked to be spaced apart from each other. The number of source select lines SSL, the number of word lines WL, and the number of drain select lines DSL are not limited to those shown in FIG. 4 and may be changed depending on the semiconductor memory device 1100. The cell strings ST may include vertical channel layers CH which vertically pass through the source select lines SSL, the word lines WL, and the drain select lines DSL, and bit lines BL which come into contact with upper ends of the vertical channel layers CH protruding upward from the drain select lines DSL and extend in the second direction (Y-direction).

Memory cells may be formed between the word lines WL and the vertical channel layers CH. Contact plugs CT may be further formed between the bit lines BL and the vertical channel layers CH.

Figure 5:
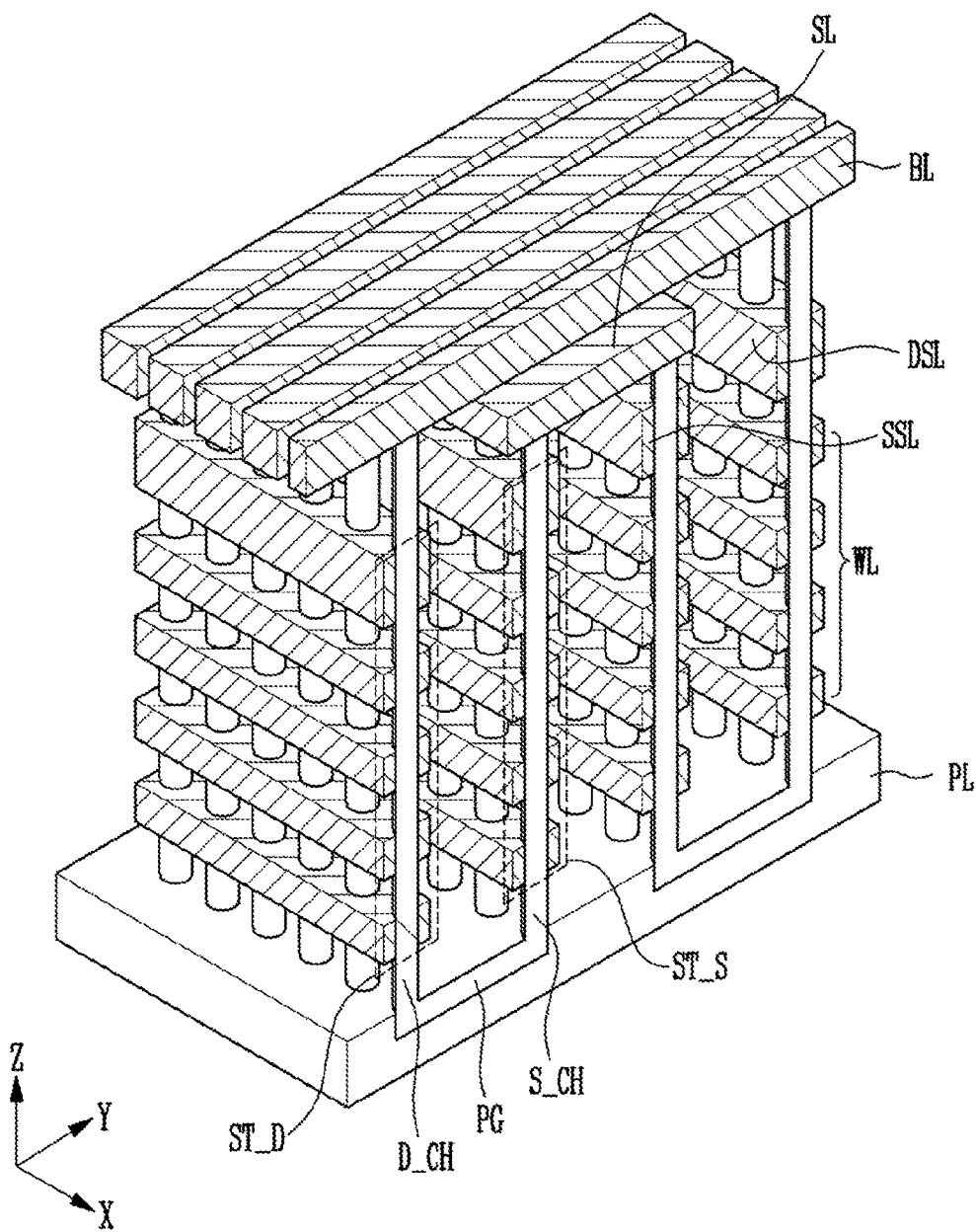
FIG. 5 is a perspective diagram illustrating an embodiment of a memory block having a three-dimensional structure.

FIG. 5 is a perspective diagram illustrating an embodiment of a memory block having a three-dimensional structure.

Referring to FIG. 5, the memory block having a three-dimensional structure may include source strings ST_S and drain strings ST_D, each of which may be formed in a vertical direction (e.g., Z-direction) on a substrate, and which are coupled to each other between the bit lines BL and the source lines SL. In an embodiment, each source string ST_S and the corresponding drain string ST_D may be coupled to each other through a pipe gate PG to form a U shape. The pipe gate PG may be formed in a pipe line PL. In more detail, the source strings ST_S may be vertically arranged between the source lines SL and the pipe line PL. The drain strings ST_D may be vertically arranged between the bit lines BL and the pipe line PL. This structure may be called "Pipe-shaped Bit Cost Scalable" (P-BiCS).

In more detail, the drain strings ST_D and the source strings ST_S may be arranged in the first direction (e.g., X-direction) and the second direction (e.g., Y-direction). The drain strings ST_D and the source strings ST_S may be alternately arranged in the second direction(Y). The drain strings ST_D may include word lines WL and drain select lines DSL which are spaced apart from each other, and drain vertical channel layers D_CH which vertically pass through the word lines WL and the drain select lines DSL. The source strings ST_S may include word lines WL and source select lines SSL which are spaced apart from each other, and source vertical channel layers S_CH which vertically pass through the word lines WL and the source select lines SSL. The drain vertical channels D_CH and the source vertical channels S_CH may be coupled to each other by pipe gates PG in the pipe line PL. The bit lines BL may come into contact with upper ends of the drain vertical channel layers D_CH, where the upper ends of the drain vertical channel layers D_CH protrude upward from the drain select lines DSL. The bit lines BL may extend in the second direction (e.g., Y direction).

Figure 6:
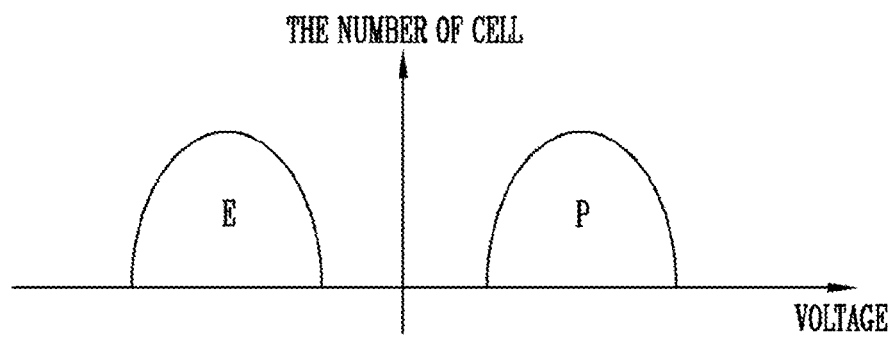
FIGS. 6 to 8 are diagrams illustrating program states of memory cells in accordance with various embodiments.
Figure 7:
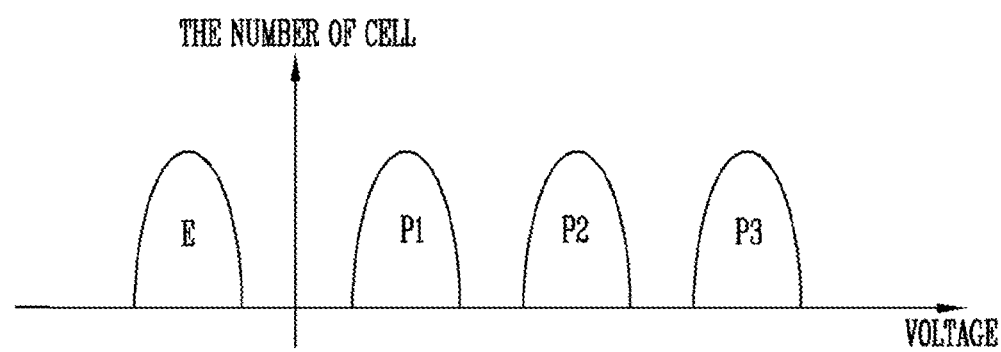
Figure 8:
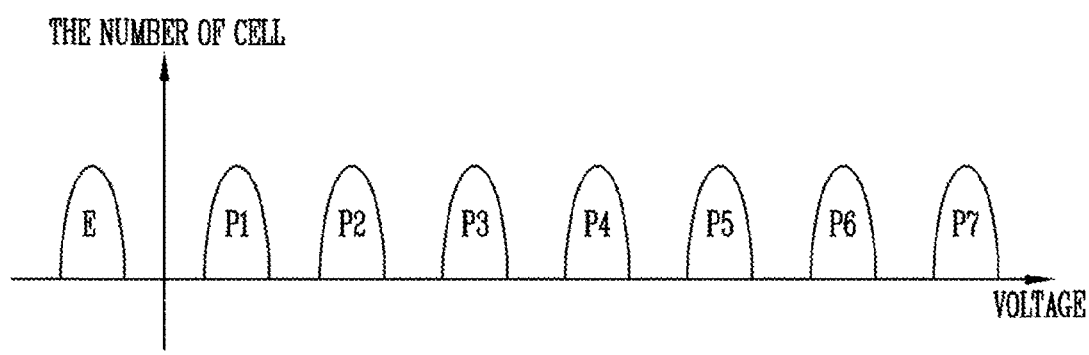

FIGS. 6 to 8 are diagrams illustrating program states of memory cells in accordance with various embodiments. FIG. 6 is a diagram illustrating a program state of a single level cell (SLC). FIG. 7 is a diagram illustrating a program state of a multi-level cell (MLC). FIG. 8 is a diagram illustrating a program state of a triple level cell (TLC).

Referring to FIG. 6, the single level cell (SLC) refers to a manner in which memory cells are programmed to have an erase state E or one program state P. For example, in the SLC manner, each of the memory cells may have data '1' corresponding to the erase state E or data '0' corresponding to the program state.

Referring to FIG. 7, the multi-level cell (MLC) refers to a manner in which memory cells are programmed to have an erase state E or three program states P1 to P3. For example, in the MLC manner, each of the memory cells may have data '11' corresponding to the erase state E or any one of data '10', '01', and '00' which respectively correspond to first to third program states.

Referring to FIG. 8, the triple level cell (TLC) refers to a manner in which memory cells are programmed to have an erase state E or seven program states P1 to P7. For example, in the triple level cell (TLC) manner, each of the memory cells may have data '111' corresponding to the erase state E or any one of data '110', '100', '000', '010', '011', '001' and '101' which respectively correspond to first to seventh program states.

In a nonvolatile memory device, because data programmed in memory cells must be retained for a long period of time, the nonvolatile memory device must have excellent retention characteristics. However, in the case of the multi-level cell (MLC) or the triple level cell (TLC), a difference in threshold voltages of the programmed memory cells is relatively large. In this case, the probability of a change in the retention characteristics is increased. For example, with regard to the triple level cell (TLC), because memory cells programmed to the seventh program state P7 have the highest threshold voltage, the possibility in which the threshold voltage of the memory cells programmed to the seventh program state P7 lowers is higher than that of memory cells programmed to first to sixth program states P1 to P6. That is, the memory cells programmed to the seventh program state P7 may have inferior retention characteristics, compared to that of the other memory cells. As in a quadruple level cell besides the above-described multi-level cell MLC or triple level cell TLC, the more program states, the more inferior the retention characteristics.

To improve the reliability of memory cells having inferior retention characteristics, in an embodiment, a compensation program operation may be further performed after a main program operation has completed.

Figure 9:
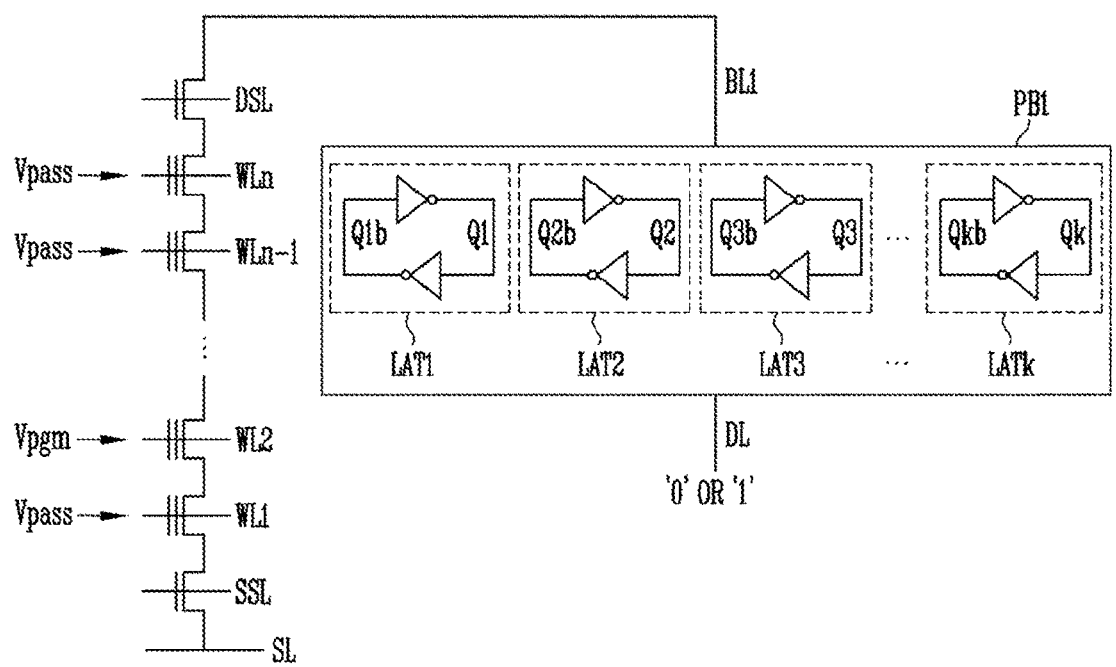
FIG. 9 is a diagram illustrating a page buffer according to an embodiment of the present disclosure.

FIG. 9 is a diagram illustrating a page buffer according to an embodiment of the present disclosure.

Referring to FIG. 9, because the page buffers (PB1 to PBI of FIG. 2) have the same or similar configuration, only the first page buffer PB1 among them will be described as an example.

The first page buffer PB1 may be coupled between a first bit line BL1 and a data line DL. The first page buffer PB1 may include a plurality of latches LAT1 to LATk (k is a positive integer) for temporarily storing data inputted from an external device, for example the memory controller 1200, or data read from memory cells. For example, the first page buffer PB1 may include first to k-th latches LAT1 to LATk. The first to k-th latches LAT1 to LATk may have the same or similar configuration. For example, the first to k-th latches LAT1 to LATk may include inverters. Each latch may include two inverters which are coupled in series to each other. For example, the first latch LAT1 may include two inverters. An output terminal of one inverter may be coupled with an input terminal of the other inverter. That is, two inverters included in the first latch LAT1 may be coupled in series to each other between a main node and an inverting node. In the first latch LAT1, a first node Q1 may be a main node, and the other node Q1*b* may be an inverting node. Therefore, the first to k-th latches LAT1 to LATk may respectively temporarily store data to main nodes Q1 to Qk. For example, if data '0' is inputted to the first node Q1 of the first latch LAT1, data '1' corresponding to inverted data of the first node Q1 may be inputted to the inverting node Q1*b*. The first to k-th latches LAT1 to LATk may be coupled to each other, and exchange data with each other. Some of the first to k-th latches LAT1 to LATk may be coupled to the data line DL, and the others may be coupled to the first bit line BL1. For example, the first latch LAT1 may be coupled to the data line DL, and the third latch LAT3 may be coupled to the first bit line BL1. The second latch LAT2 may temporarily store data inputted to the first latch LAT1 before the data inputted to the first latch LAT1 is transmitted to the third latch LAT3.

For example, with regard to a program operation, if all pieces of logical data of a selected page are programmed, logical data of a subsequent page may also be programmed. For example, in the case of a program operation using the TLC manner, because three pieces of logical data may be programmed in one memory cell, a program operation on a selected page may be performed while increasing a program voltage in steps until all program operations for three logical data are completed. During a program operation, a program voltage may be applied to a selected word line, and a pass voltage may be applied to the other word lines.

The program operation may be performed in an incremental step pulse program (ISPP) manner in which the program voltage is increased in steps. For example, data (0 or 1) transmitted from the external device through the data line DL may be inputted to the first latch LAT1. The data inputted to the first latch LAT1 may be temporarily stored in the second latch LAT2 and then transmitted to the third latch LAT3 when, in one example, the main program operation is completed. For example, when first logical data of a first page is inputted to the first latch LAT1, the first logical data may be successively transmitted to the first to third latches LAT1 to LAT3. When the first logical data is transmitted to the third latch LAT3, data for a following program operation may be inputted to the first latch LAT. For example, when the first logical data is inputted to the second and third latches LAT2 and LAT3, second logical data of the first page may be inputted to the first latch LAT1. While program and verify operations for the first logical data are performed, the first logical data inputted to the second latch LAT2 may be retained. For instance, as a result of the verify operation for the first logical data, when it is determined that the program operation for the first logical data has been completed, the second logical data inputted to the first latch LAT1 may be successively transmitted to the second and third latches LAT2 and LAT3, and program and verify operations for the second logical data may be performed. In other words, data stored in the second latch LAT2 may be retransmitted to the third latch LAT3 if the verify operation has passed, and voltage of the bit line BL may be adjusted using the data retransmitted to the third latch LAT3. Although a program operation for last logical data of a selected page has completed, the last logical data of the selected page may be retained in the second latch LAT2.

Figure 10:
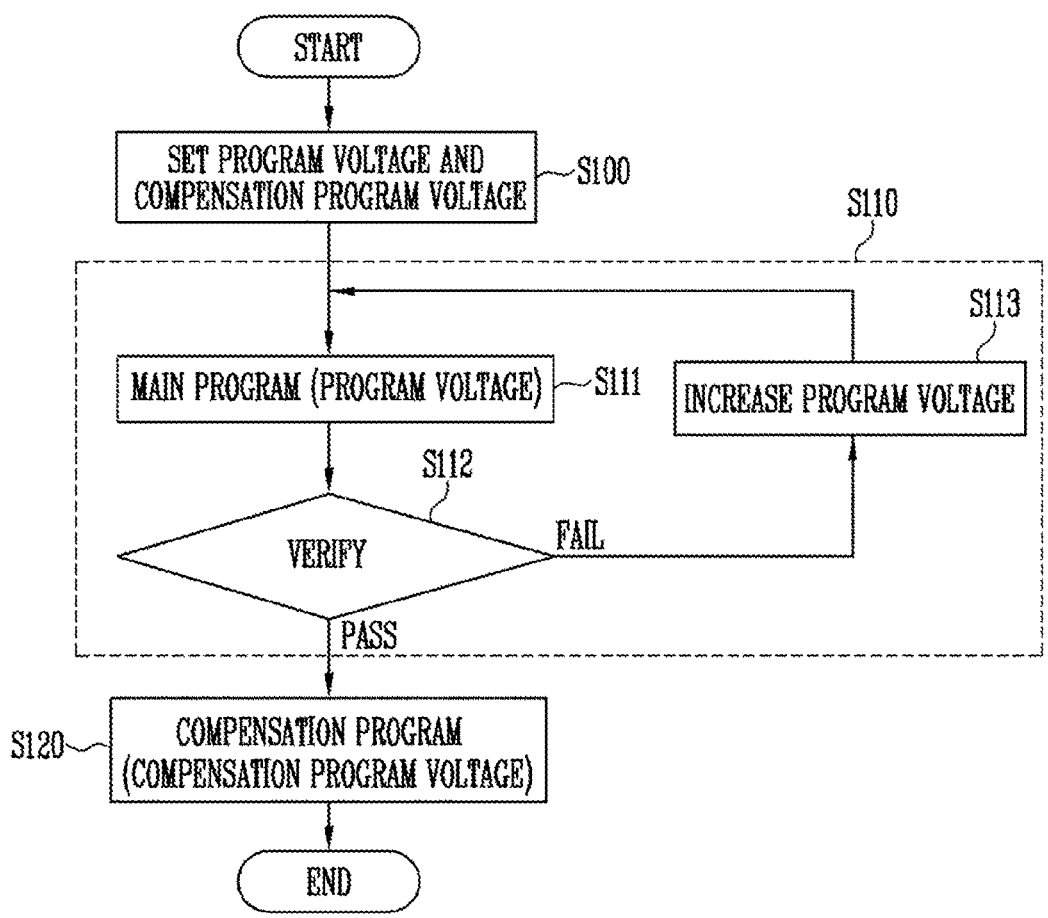
FIG. 10 is a flowchart illustrating a program operation according to an embodiment of the present disclosure.

FIG. 10 is a flowchart illustrating a program operation according to an embodiment of the present disclosure.

Referring to FIG. 10, when a program command is received at the control logic (300 of FIG. 2), the control logic 300 may set a program voltage and a compensation program voltage for a program operation of a selected page, at S100. For example, the program voltage may be a voltage used for a main program operation, and the compensation program voltage may be a voltage used for a compensation program operation. For instance, a start program voltage and a step voltage may be set as a program voltage to be used for a main program operation. The start program voltage may be a voltage which is first applied to a selected word line in an ISPP program operation. The step voltage may be a level by which the program voltage increases every time a program loop is performed. For example, while the program loop is performed, the program voltage may increase by step voltages from the start program voltage. The compensation program voltage may be set to a positive voltage equal to or lower than the highest program voltage among program voltages used for program loops.

When voltages to be used for the program operation are set, at S100, the control logic 300 may control the peripheral circuits (200 of FIG. 2) such that the main program operation of the selected page is performed, at S110. For example, the main program operation S110 may include a main program step S111, a verify operation performing step S112, and a program voltage increasing step S113.

At the main program step S111, the program voltage may be applied to a selected word line to increase threshold voltages of selected memory cells of the selected page. At the verify operation performing step S112, it may be determined whether the threshold voltages of the selected memory cells of the selected page have been increased to a target voltage. When the threshold voltages of the selected memory cells are lower than the target voltage, it may be determined that the verify operation has failed. When all of the threshold voltages of the selected memory cells are equal to or higher than the target voltage, it may be determined that the verify operation has passed. The main program step S111 and the verify operation performing step S112 may form one program loop.

If it is determined that the verify operation has failed, the control logic 300 may control the peripheral circuits 200 such that the program voltage is increased by the step voltage, at S113. For example, the control logic 300 may control the peripheral circuits 200 such that steps S111 to S113 are repeated until the threshold voltages of the selected memory cells of the selected page are equal to or higher than the target voltage.

If it is determined that the verify operation has passed, the control logic 300 may control the peripheral circuit 200 such that the compensation program operation of the selected page is performed, at S120. For example, the compensation program operation may be performed on some memory cells to improve retention characteristics of the memory cells that are inferior to the other memory cells, among the memory cells included in the selected page. For instance, the compensation program operation may be performed for memory cells programmed to the highest program state, among the memory cells included in the selected page. In an embodiment, the compensation program operation may be performed by applying a compensation program voltage to a word line coupled to a selected page. In one example, the control logic 300 may control the peripheral circuits 200 such that a compensation program voltage is applied to a word line coupled to a selected page. Target memory cells on which the compensation program operation is to be performed may be selected depending on external data which is last used during the program operation on the selected page. For example, a program enable voltage (e.g., 0V) or a program inhibit voltage (e.g., supply voltage) may be applied to bit lines depending on the external data that is last used. In one example, the control logic 300 may adjust voltages of the bit lines coupled to the selected page depending on the loaded data.

The compensation program operation may be performed on each page. For example, because a column of target cells on which the compensation program operation is to be performed may be changed in each page, the compensation program operation may be performed every time a main program operation of each page is completed.

The compensation program operation will be described in detail below.

Figure 11:
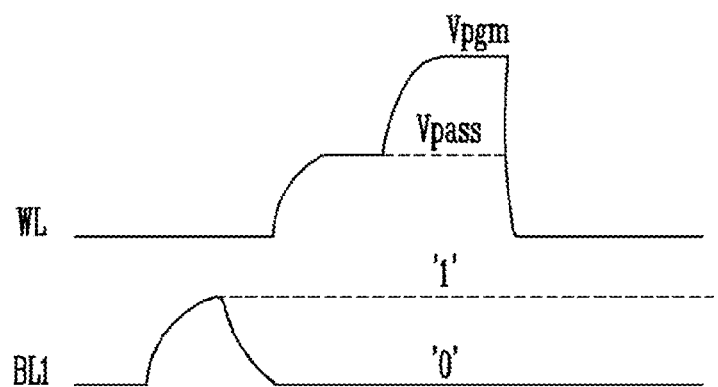
FIG. 11 is a diagram illustrating voltages which are applied to word lines and bit lines, during a program operation according to an embodiment of the present disclosure.

FIG. 11 is a diagram illustrating voltages which are applied to word lines and bit lines, during a program operation according to an embodiment of the present disclosure.

Referring to FIG. 11, voltages of bit lines may be adjusted depending on external data inputted to page buffers, during a program operation. For example, if data '0' is inputted to the first page buffer coupled with the first bit line BL1, a program enable voltage (e.g., 0V) may be applied to the first bit line BL1. For example, if data '1' is inputted to the first page buffer coupled with the first bit line BL1, a program inhibit voltage (e.g., supply voltage) may be applied to the first bit line BL1. A main program operation and a compensation program operation will be illustrated by way of example. After the first bit line BL1 is precharged to a positive voltage, the first bit line BL1 may be maintained in a precharge state (data '1') or discharged (data '0') depending on external data inputted to the first page buffer. Subsequently, after a pass voltage Vpass has been applied to the word lines, a program voltage Vpgm or a compensation program voltage may be applied to a selected word line.

Figure 12:
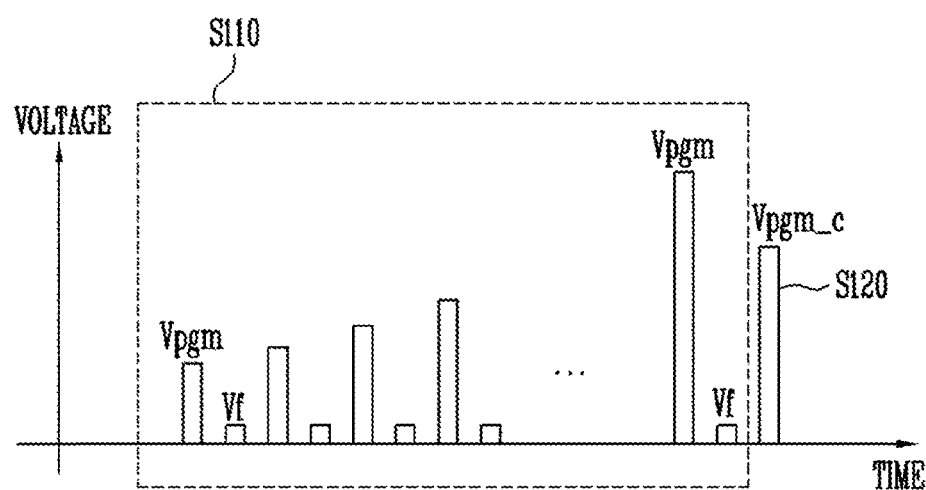
FIG. 12 is a diagram illustrating voltages which are applied to a selected word line, during a program operation according to an embodiment of the present disclosure.

FIG. 12 is a diagram illustrating a voltage which is applied to a selected word line during a program operation according to an embodiment of the present disclosure.

Referring to FIGS. 11 and 12, a program voltage Vpgm or a verify voltage Vf may be applied to a selected word line in the main program operation (S110 of FIG. 10), and a compensation program voltage Vpgm_c may be applied to the selected word line in the compensation program operation (S120 of FIG. 10). Because the main program operation S110 may be performed in the ISPP manner, the program voltage Vpgm may be increased in steps until the verify operation passes. The control logic 300 may control peripheral circuits 200 to perform the compensation program operation S120 by applying only the compensation program voltage Vpgm_c to the selected word line without a verify operation.

Figure 13:
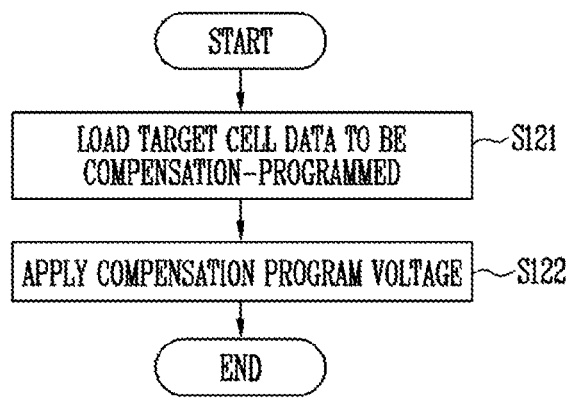
FIG. 13 is a flowchart illustrating an embodiment of a compensation program operation of FIG. 10.

FIG. 13 is a flowchart illustrating an embodiment of the compensation program operation of FIG. 10.

The compensation program operation (S120 of FIG. 10) will be described in detail with reference to FIG. 13. The compensation program operation S120 may include an operation S121 of loading data of a target cell on which the compensation program and a compensation program voltage apply operation S122 is to be performed.

The target cell data loading operation S121 may be performed by reloading external data which is last used in a selected page of page buffers. For example, a selected page may be programmed using a plurality of logical data. There will be described an example of a program operation which is performed in the TLC manner.

TABLE 1

| Status | PV7 |
|---|---|
| LAT1 | 1 |
| LAT2 | 0 |
| LAT3 | 1 |

In the TLC program operation, statuses of memory cells may be divided into an erase state and first to seventh program states. The erase state refers to a state in which the threshold voltage is lowest. The first program state refers to a state in which the threshold voltage is lowest among the threshold voltages of the program states where the program states are higher than the erase state. The threshold voltage is gradually increased from the first program state toward the seventh program state. In 'Table 1', the term 'PV7' refers to the seventh program state.

Depending on logical data inputted from the external device, each of selected memory cells of a selected page may be maintained in the erase state or be programmed to any one of the first to seventh program states. Among the selected memory cells, memory cells programmed to the seventh program state PV7 have the most inferior retention characteristics because the threshold voltage of these memory cells is highest. Therefore, if a main program operation on the memory cells to be programmed to the first to seventh program states has completed, a compensation program operation may be selectively performed only on the memory cells programmed to the seventh program state PV7. For example, during the main program operation on memory cells to be programmed to the seventh program state PV7, data '0' may be inputted to only page buffers corresponding to a column of the memory cells to be programmed to the seventh program state PV7, and data '1' may be inputted to the other page buffers. Here, the term 'data' refers to data inputted to a latch that is coupled with the bit lines among a plurality of latches LAT1 to LAT3 included in the page buffers. Data stored in the third latch LAT3 may be changed depending on the result of a verify operation performed during the main program operation. For example, if a verify operation on memory cells to be programmed to the seventh program state PV7 has passed, data of latches coupled to the corresponding memory cells are all changed to '1'. However, the original data is retained in other latches included in each page buffer. For example, when the main program operation corresponding to the seventh program state PV7 has completed, there are no more operations to be performed. Thus, the external data for the program operation corresponding to the seventh program state PV7 may be retained in latches of each page buffer. Therefore, the compensation program operation may be performed by transmitting the original data retained in the page buffers to latches coupled to respective bit lines, and adjusting voltages of the bit lines depending on data transmitted to the bit lines.

During the compensation program operation, the compensation program voltage Vpgm_c applied to a selected word line may be a positive voltage equal to or lower than the highest voltage among the program voltages Vpgm used in the main program operation.

Figure 14:
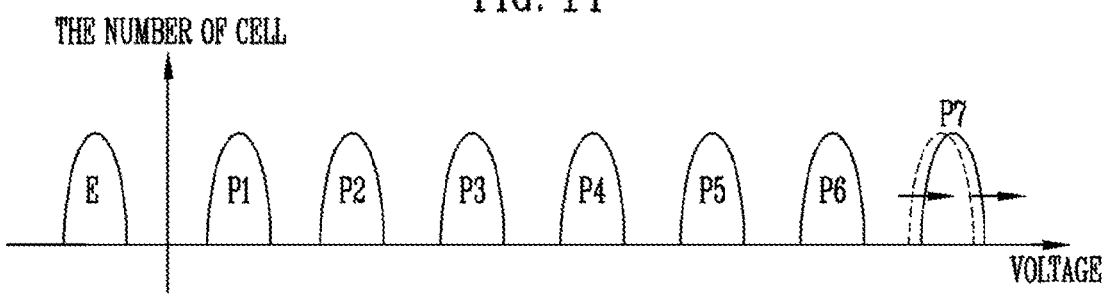
FIGS. 14 and 15 are diagrams illustrating a threshold voltage distribution of memory cells, during a program operation according to an embodiment of the present disclosure.
Figure 15:
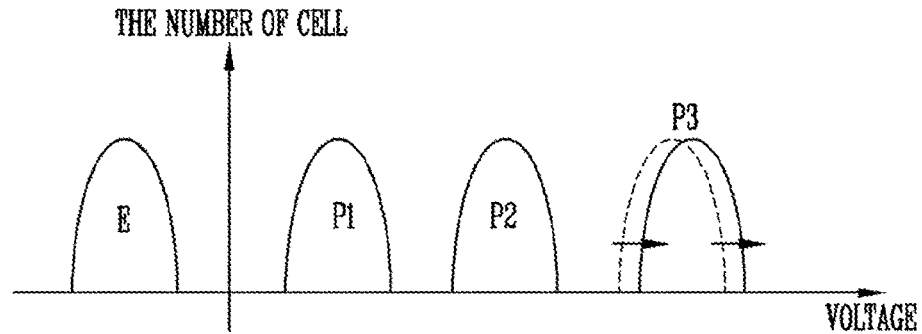

FIGS. 14 and 15 are diagrams illustrating a threshold voltage distribution of memory cells, during a program operation according to an embodiment of the present disclosure.

Referring to FIG. 14, during a TLC program operation, when a compensation program operation is performed as described above, the threshold voltage of memory cells programmed to the seventh program state PV7 may be increased. For example, because the compensation program operation is selectively performed only on the memory cells programmed to the seventh program state PV7, threshold voltages of memory cells programmed to the first to sixth program states PV1 to PV6 may be maintained in a threshold voltage distribution formed when a main program operation is completed. In other words, memory cells programmed to the most significant program state are set to memory cells programmed to a highest program state in the main program operation. That is, in an embodiment, the threshold voltage of the memory cells programmed to the seventh program state PV7 having inferior retention characteristics are selectively increased. Thus, although the threshold voltage of the memory cells programmed to the seventh program state PV7 is reduced after the program operation has completed, a phenomenon in which even a read voltage is reduced may be prevented.

Referring to FIG. 15, the above-described compensation program operation may also be performed in an MLC program operation. Because the third program state PV3 is the highest program state in the MLC program operation, the compensation program operation may be selectively performed only on memory cells programmed to the third program state PV3. The threshold voltages of only the memory cells programmed to the third program state PV3 may be increased by the compensation program operation.

The above-described compensation program operation may be applied to an operation, such as a QLC program operation, in which pieces of logical data are programmed in one memory cell, as well as to the MLC and TLC program operations.

Figure 16:
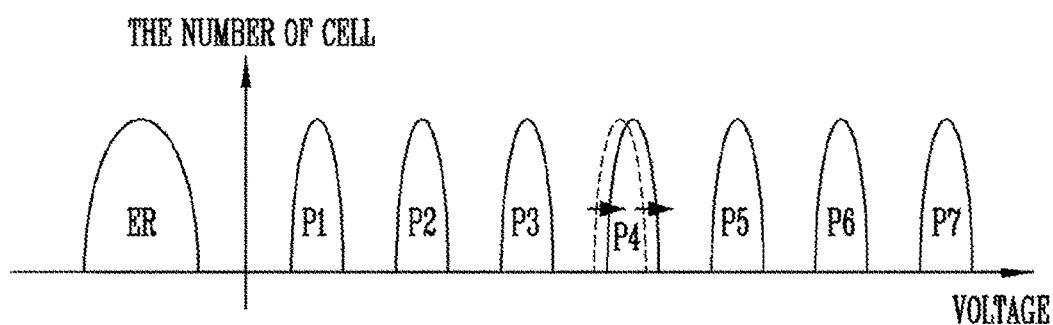
FIG. 16 is a diagram for describing a threshold voltage distribution of a program operation in accordance with an embodiment of the present disclosure.

FIG. 16 is a diagram for describing a threshold voltage distribution of a program operation in accordance with an embodiment of the present disclosure.

Referring to FIG. 16, the compensation program operation may be performed while the main program operation is performed, even if selected memory cells are not memory cells programmed to a seventh program state P7 having the highest threshold voltage distribution.

There will be described an example of a program operation which is performed in the TLC manner. A compensation program operation may be performed before a program operation corresponding to the seventh program state P7 having the highest level among first to seventh programmed states P1 to P7 is performed. For example, an additional compensation program operation may be performed during a program loop for programming selected memory cells to a fourth program state P4. If the compensation program operation is performed on memory cells to be programmed to the fourth program state P4 or memory cells programmed to the fourth program state, the probability of occurrence of a read error during a read operation may be reduced. Here, the fourth program state P4 is only an example for the sake of convenience in understanding the present disclosure; therefore, the present embodiment is not limited thereto.

Figure 17:
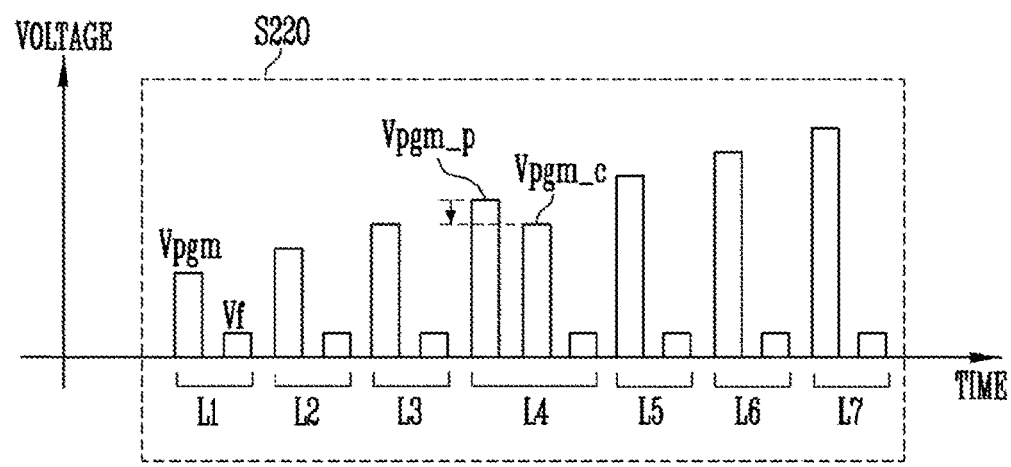
FIG. 17 is a diagram for describing a program operation in accordance with an embodiment of the present disclosure.

FIG. 17 is a diagram for describing a program operation in accordance with an embodiment of the present disclosure.

Referring to FIG. 17, a compensation program operation may be performed while a main program operation S220 is performed. For example, the compensation program operation may be performed when the main program operation S220 of programming selected memory cells to a fourth program state P4 is performed. During the main program operation S220, a plurality of program loops L1 to L7 may be performed. For example, a compensation program voltage Vpgm_c may be used in at least one program loop among the first to seventh program loops L1 to L7. The compensation program voltage Vpgm_c may be set to a positive voltage lower than a main program voltage Vpgm_p of a selected program loop (e.g., a fourth program loop L4). The compensation program voltage Vpgm_c may be applied to a selected word line before a verify voltage Vf is applied to the selected word line after the main program voltage Vpgm_p used in the fourth program loop L4 has been applied to the selected word line for a predetermined time period. In other words, in the fourth program loop L4, the compensation program voltage Vpgm_c may be applied to the selected word line during a period between periods for which the main program voltage Vpgm_p and the verify voltage Vf are applied to the selected word line.

Therefore, in the fourth program loop L4, a verify operation may be performed after the compensation program voltage Vpgm_c has been applied to the selected word line for a predetermined time period.

Although FIG. 17 illustrates that the compensation program voltage Vpgm_c is used in the fourth program loop L4, the compensation program voltage Vpgm_c may be used in a plurality of program loops among the first to seventh program loops L1 to L7. In the case where the compensation program voltage Vpgm_c is used in a plurality of program loops, the compensation program voltage Vpgm_c may be set to a positive voltage lower than a main program voltage Vpgm_p of a corresponding program loop. In other words, a plurality of memory cells included in a selected page may be programmed to have different threshold voltage distributions. In this embodiment, before a verify operation is performed, a compensation program operation may be performed by applying a compensation program voltage to selected memory cells to be programmed to a selected threshold voltage distribution among threshold voltage distributions other than the highest threshold voltage distribution. Here, the compensation program voltage may be set to a positive voltage lower than a main program voltage Vpgm_p most recently applied to the selected word line.

Figure 18:
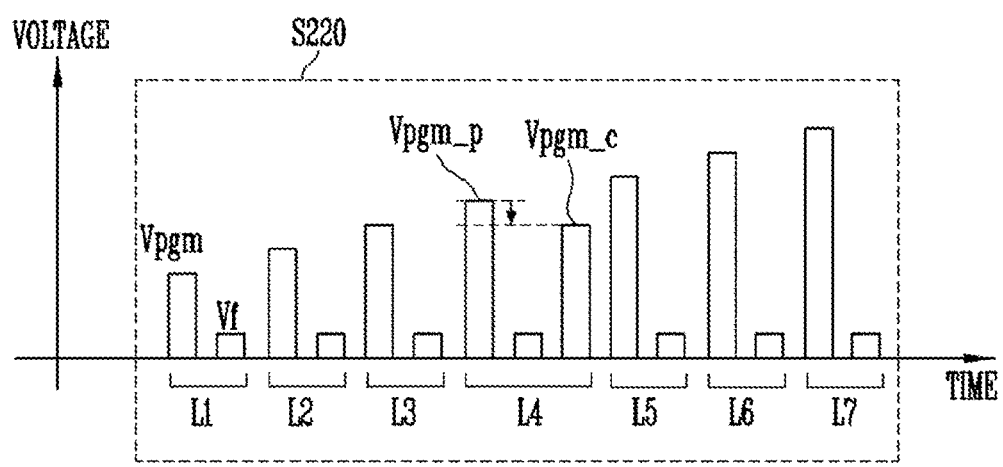
FIG. 18 is a diagram for describing a program operation in accordance with an embodiment of the present disclosure.

FIG. 18 is a diagram for describing a program operation in accordance with an embodiment of the present disclosure.

Referring to FIG. 18, a compensation program voltage Vpgm_c may be applied to a selected word line after a verify operation has been performed in a selected program loop. If a compensation program operation is performed in a fourth program loop L4, a compensation program voltage Vpgm_c may be applied to the selected word line after a main program voltage Vpgm_p and a verify voltage Vf each has been applied to the selected word line for a predetermined time period.

However, the compensation program voltage Vpgm_c is required to be applied in common to selected memory cells in a program loop. Here, data of a latch to be used during a verify operation in a page buffer may be changed after the verify operation has been performed. Therefore, as illustrated in FIG. 18, if the compensation program voltage is applied to the selected word line after the verify operation, the page buffer may include a latch which is provided separately from the latch used for the verify operation and is able to temporarily store original data.

A method of driving the page buffer will be described in detail below.

Figure 19:
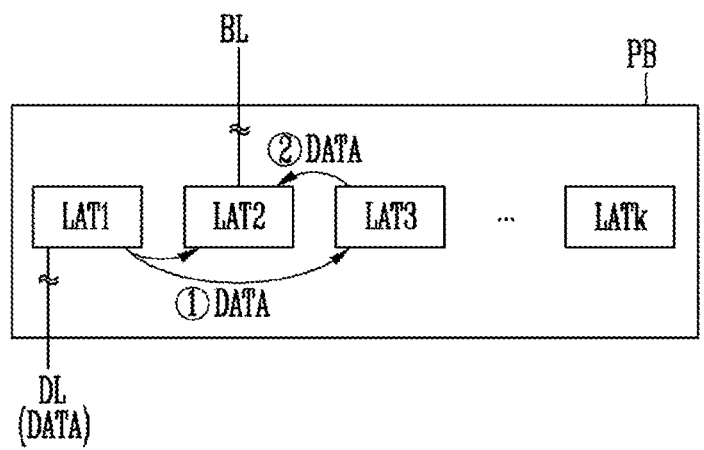
FIG. 19 is a diagram for describing a method of driving a page buffer according to the embodiment described with reference to FIG. 18.

FIG. 19 is a diagram for describing a method of driving the page buffer according to the embodiment described with reference to FIG. 18.

Referring to FIG. 19, the page buffer PB may include a plurality of latches LAT1 to LATk. Although FIG. 19 illustrates only first to k-th latches LAT1 to LATk related to the present embodiment, the page buffer PB may further include a plurality of transistors for transmitting data.

The page buffer PB may include a first latch LAT1 configured to receive data DATA through a data line DL, a second latch LAT2 which is used during a verify operation, and a third latch LAT3 configured to temporarily store original data DATA during a compensation program operation.

In more detail, during a program operation, original data DATA received through the data line DL during a program operation may be temporarily stored in the first latch LAT1. The original data DATA stored in the first latch LAT1 may be transmitted to each of the second and the third latches LAT2 and LAT3 (①). In other words, since data for a subsequent program operation may be received to the first latch LAT1, the data input to the first latch LAT1 may be copied to the second and the third latches LAT2 and LAT3.

Since data stored in the second latch LAT2 may be changed while a verify operation is performed, data DATA stored in the third latch LAT3 may be transmitted to the second latch LAT2 after the verify operation has been performed in a selected program loop. After the data DATA has been transmitted from the third latch LAT3 to the second latch LAT2, the voltage of the bit line BL is set based on the data DATA stored in the second latch LAT2, and the compensation program operation may be performed. Depending on the data DATA stored in the second latch LAT2, the potential of the bit line BL may be precharged to 0 V or a positive voltage. The compensation program operation may be performed on memory cells coupled to the bit line BL to which a voltage of 0 V is applied.

Figure 20:
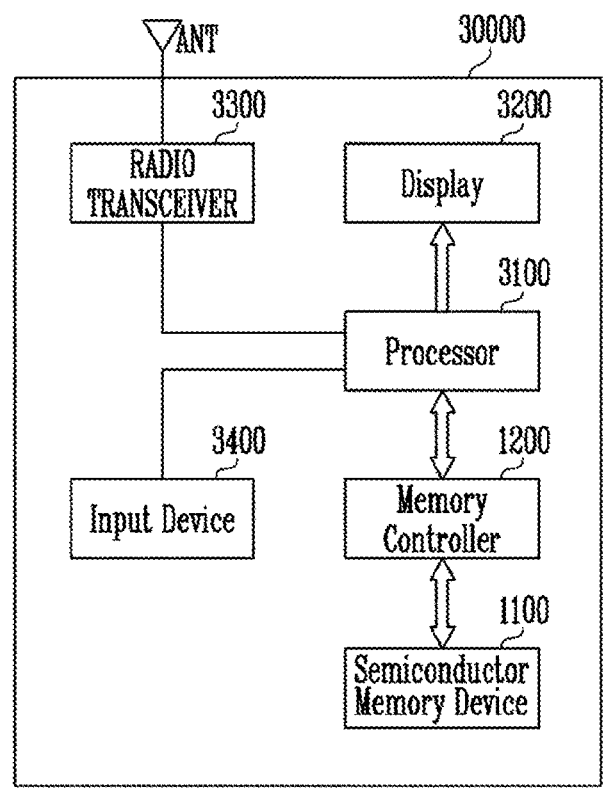
FIG. 20 is a block diagram for describing an embodiment of a memory system including a semiconductor memory device shown in FIG. 2.

FIG. 20 is a block diagram for describing an embodiment of a memory system including the semiconductor memory device shown in FIG. 2.

Referring to FIG. 20, a memory system 30000 may be embodied in a cellular phone, a smartphone, a tablet PC, a personal digital assistant (PDA), or a wireless communication device. The memory system 30000 may include the semiconductor memory device 1100 and the memory controller 1200 capable of controlling operation of the semiconductor memory device 1100. The memory controller 1200 may control, under the control of a processor 3100, a data access operation, e.g., a program operation, an erase operation or a read operation, of the semiconductor memory device 1100.

Data programmed in the semiconductor memory device 1100 may be outputted through a display 3200 under control of the memory controller 1200.

A radio transceiver 3300 may exchange a wireless signal through an antenna ANT. For example, the radio transceiver 3300 may change a wireless signal received through the antenna ANT into a signal which may be processed in the processor 3100. Therefore, the processor 3100 may process a signal outputted from the radio transceiver 3300 and transmit the processed signal to the memory controller 1200 or the display 3200. The memory controller 1200 may program a signal processed by the processor 3100 to the semiconductor memory device 1100. Furthermore, the radio transceiver 3300 may change a signal outputted from the processor 3100 into a wireless signal, and output the changed wireless signal to the external device through the antenna ANT. An input device 3400 is a device which may be used to input a control signal for controlling operation of the processor 3100 or data to be processed by the processor 3100. The input device 3400 may be embodied by a pointing device such as a touch pad and a computer mouse, a keypad or a keyboard. The processor 3100 may control operation of the display 3200 such that data outputted from the memory controller 1200, data outputted from the radio transceiver 3300, or data outputted form the input device 3400 is outputted through the display 3200.

According to an embodiment, the memory controller 1200 capable of controlling the operation of the semiconductor memory device 1100 may be embodied as a part of the processor 3100 or a chip provided separately from the processor 3100.

Figure 21:
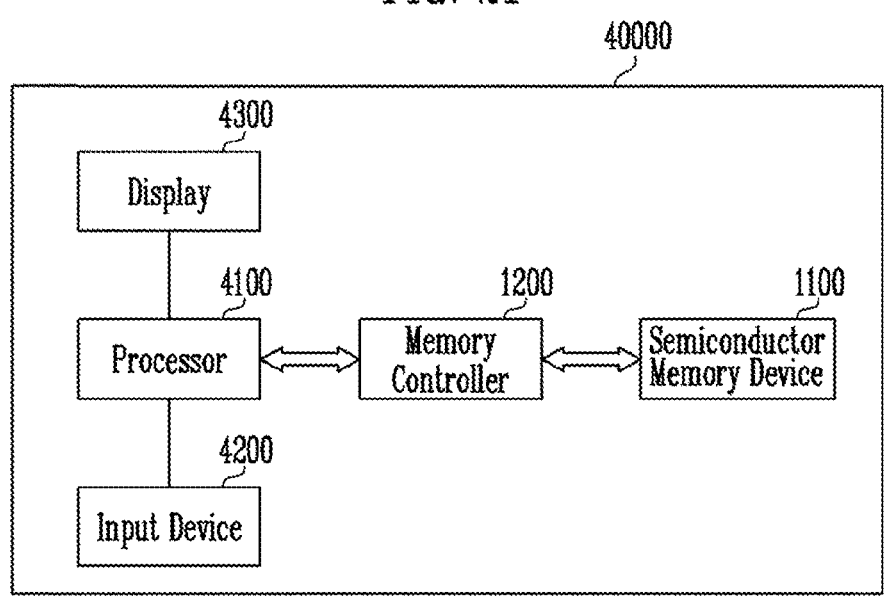
FIG. 21 is a block diagram for describing an embodiment of a memory system including a semiconductor memory device shown in FIG. 2.

FIG. 21 is a block diagram for describing an embodiment of a memory system including the semiconductor memory device shown in FIG. 2.

Referring to FIG. 21, the memory system 40000 may be embodied in a personal computer, a tablet PC, a net-book, an e-reader, a personal digital assistant (PDA), a portable multimedia player (PMP), an MP3 player, or an MP4 player.

The memory system 40000 may include the semiconductor memory device 1100 and the memory controller 1200 capable of controlling the data processing operation of the semiconductor memory device 1100.

A processor 4100 may output data stored in the semiconductor memory device 1100 through a display 4300, depending on data inputted from an input device 4200. For example, the input device 4200 may be embodied by a point device such as a touch pad or a computer mouse, a keypad or a keyboard.

The processor 4100 may control the overall operation of the memory system 40000 and control the operation of the memory controller 1200. According to an embodiment, the memory controller 1200 capable of controlling the operation of the semiconductor memory device 1100 may be embodied as a part of the processor 4100 or a chip provided separately from the processor 4100.

Figure 22:
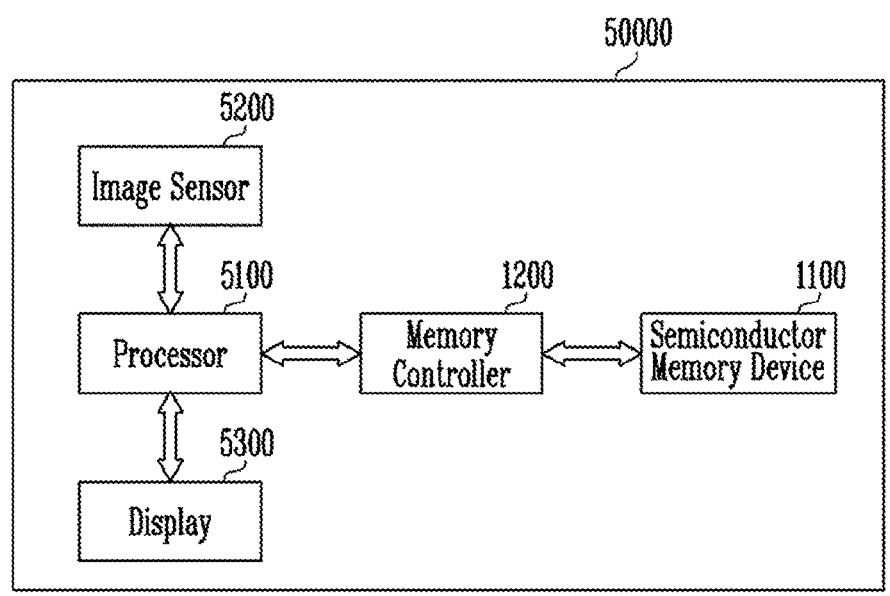
FIG. 22 is a block diagram for describing an embodiment of a memory system including a semiconductor memory device shown in FIG. 2.

FIG. 22 is a block diagram for describing an embodiment of a memory system including the semiconductor memory device shown in FIG. 2.

Referring to FIG. 22, a memory system 50000 may be embodied in an image processing device, e.g., a digital camera, a portable phone provided with a digital camera, a smartphone provided with a digital camera, or a tablet PC provided with a digital camera.

The memory system 50000 may include the semiconductor memory device 1100 and the memory controller 1200 capable of controlling a data processing operation, e.g., a program operation, an erase operation or a read operation, of the semiconductor memory device 1100.

An image sensor 5200 of the memory system 50000 may convert an optical image into digital signals. The converted digital signals may be transmitted to a processor 5100 or the memory controller 1200. Under control of the processor 5100, the converted digital signals may be outputted through a display 5300 or stored in the semiconductor memory device 1100 through the memory controller 1200. Furthermore, data stored in the semiconductor memory device 1100 may be outputted through the display 5300 under control of the processor 5100 or the memory controller 1200.

According to an embodiment, the memory controller 1200 capable of controlling operation of the semiconductor memory device 1100 may be embodied as a part of the processor 5100, or a chip provided separately from the processor 5100.

Figure 23:
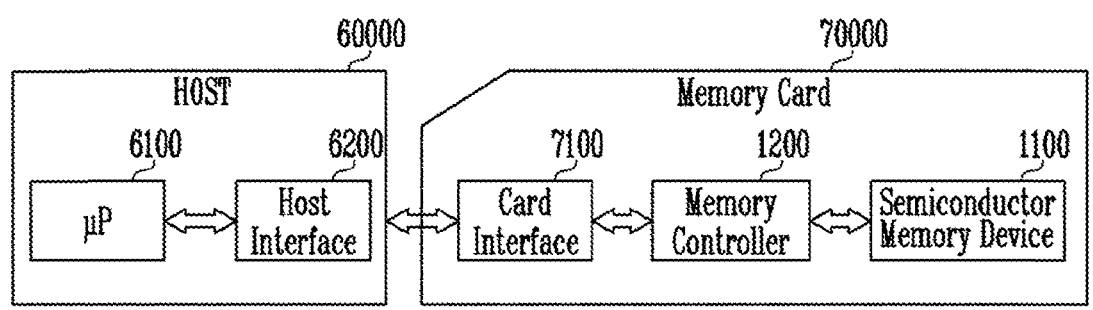
FIG. 23 is a block diagram for describing an embodiment of a memory system including a semiconductor memory device shown in FIG. 2.

FIG. 23 is a block diagram for describing an embodiment of a memory system including the semiconductor memory device shown in FIG. 2.

Referring to FIG. 23, a memory system 70000 may be embodied in a memory card or a smart card. The memory system 70000 may include the semiconductor memory device 1100, the memory controller 1200, and a card interface 7100.

The memory controller 1200 may control data exchange between the semiconductor memory device 1100 and the card interface 7100. According to an embodiment, the card interface 7100 may be a secure digital (SD) card interface or a multi-media card (MMC) interface, but it is not limited thereto.

The card interface 7100 may interface data exchange between a host 60000 and the memory controller 1200 depending on a protocol of the host 60000. The card interface 7100 according to an embodiment may support a universal serial bus (USB) protocol, and an Interchip (IC)-USB protocol. Here, the card interface may refer to hardware capable of supporting a protocol which is used by the host 60000, software installed in the hardware, or a signal transmission method.

When the memory system 70000 is connected to a host interface 6200 of the host 60000 such as a PC, a tablet PC, a digital camera, a digital audio player, a cellular phone, console video game hardware, or a digital set-top box, the host interface 6200 may perform data communication with the semiconductor memory device 1100 through the card interface 7100 and the memory controller 1200 under control of a microprocessor 6100.

The present disclosure may improve the reliability of a program operation of a semiconductor memory device and retention characteristics of the semiconductor memory device.

Examples of embodiments have been disclosed herein, and although specific terms are employed, they are used and are to be interpreted in a generic and descriptive sense only and not for purposes of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A semiconductor memory device comprising:
a plurality of memory cells configured to be programmed to have different threshold voltage distributions;
peripheral circuits configured to perform a program operation on selected memory cells among the plurality of memory cells by applying a main program voltage to a word line coupled to the plurality of memory cells, perform a verify operation on the selected memory cells by applying a verify voltage to the word line, and perform a compensation program operation on the selected memory cells by applying a compensation program voltage to the word line; and
a control logic configured to control the peripheral circuits such that the compensation program operation is performed by applying the compensation program voltage to the selected memory cells to be programmed to a selected threshold voltage distribution among the threshold voltage distributions except for a highest threshold voltage distribution,
wherein the compensation program voltage has a positive voltage lower than the main program voltage most recently applied to the word line.

2. The semiconductor memory device according to claim 1, wherein the peripheral circuits program the selected memory cells by applying the main program voltage to the word line, and then performs the compensation program operation by applying the compensation program voltage to the word line before performing the verify operation on the selected memory cells.

3. The semiconductor memory device according to claim 2,
wherein the peripheral circuits perform a plurality of program loops including the program operation and the verify operation such that the selected memory cells have the selected threshold voltage distribution,
wherein the peripheral circuits perform the compensation program operation on some program loops among the program loops.

4. The semiconductor memory device according to claim 3, wherein, in the some program loops, the compensation program operation is performed by applying the main program voltage to the word line, applying the compensation program voltage to the word line, and then applying the verify voltage to the word line.

5. The semiconductor memory device according to claim 1, wherein the peripheral circuits program the selected memory cells by applying the main program voltage to the word line, and then perform the compensation program operation by performing the verify operation on the selected memory cells and then applying the compensation program voltage to the word line.

6. The semiconductor memory device according to claim 5, wherein the peripheral circuits comprise:
a voltage generation circuit configured to generate and output the main program voltage, the verify voltage, or the compensation program voltage under control of the control logic; and
page buffers coupled to the plurality of memory cells through bit lines, and including first latches configured to be used during the verify operation, and second latches configured to temporarily store original data.

7. The semiconductor memory device according to claim 6,
wherein the page buffers further include third latches configured to temporarily store the original data input from an external device,
wherein the page buffers temporarily store the original data input from the external device in the third latches, and
wherein the page buffers transmit the original data stored in the third latches to the first and the second latches.

8. The semiconductor memory device according to claim 7,
wherein the original data stored in the first latches varies depending on a result of the verify operation, and
wherein the original data stored in the second latches is transmitted to the first latches after the verify operation is performed.

9. The semiconductor memory device according to claim 8, wherein, when the original data stored in the second latches is transmitted to the first latches, the page buffers selectively precharge the bit lines depending on the original data input to the first latches.

10. The semiconductor memory device according to claim 9, wherein, when the bit lines are selectively precharged, the voltage generation circuit outputs the compensation program voltage.

* * * * *

UNITED STATES PATENT AND TRADEMARK OFFICE
CERTIFICATE OF CORRECTION

Page 1 of 1

PATENT NO. : 11,114,173 B2
APPLICATION NO. : 16/510508
DATED : September 7, 2021
INVENTOR(S) : Hye Lyoung Lee, Bong Hoon Lee and Chan Lim It is certified that error appears in the above-identified patent and that said Letters Patent is hereby corrected as shown below:

On the Title Page

Item (71) Applicant:
Replace "SK hynix Inc., Incheon-si (KR)" with --SK hynix Inc., Icheon-si (KR)--

Item (73) Assignee:
Replace "SK hynix inc., Icheon-si (KR)" with --SK hynix Inc., Icheon-si (KR)--

Signed and Sealed this
Sixteenth Day of November, 2021

Drew Hirshfeld
*Performing the Functions and Duties of the*
*Under Secretary of Commerce for Intellectual Property and*
*Director of the United States Patent and Trademark Office*